(12) United States Patent
Jones et al.

(10) Patent No.: US 6,201,386 B1
(45) Date of Patent: Mar. 13, 2001

(54) METHOD FOR DEMAGNETIZING AND MEASURING REMANENCE AND COERCIVITY CHARACTERISTICS OF A MAGNETIC SAMPLE

(75) Inventors: David Geraint Rhys Jones, Bristiol; Mervyn Frederick Lear, Bristol, both of (GB)

(73) Assignee: Redcliffe Magtronics Limited, Bristol (GB)

( * ) Notice: Subject to any disclaimer, the term of this patent is extended or adjusted under 35 U.S.C. 154(b) by 0 days.

(21) Appl. No.: 09/064,787

(22) Filed: Apr. 23, 1998

(30) Foreign Application Priority Data

Apr. 23, 1997 (GB) .................................................. 9708219

(51) Int. Cl.$^7$ ............................. G01N 27/72; G01R 33/12
(52) U.S. Cl. ............................................ 324/205; 324/223
(58) Field of Search ................................. 324/205, 223, 324/251, 235, 209, 222, 226, 233–243, 262; 209/567; 335/284; 361/143, 147, 267

(56) References Cited

U.S. PATENT DOCUMENTS 4,782,293 * 11/1988 Steingroever et al. .............. 324/205
5,394,083 * 2/1995 Jiles .................................... 324/223

* cited by examiner

Primary Examiner—Jay Patidar
(74) Attorney, Agent, or Firm—Connolly Bove Lodge & Hutz LLP

(57) ABSTRACT

A method and apparatus for determining remanence and coercivity of high strength rare earth magnets, without full determination of their hysteresis characteristics and subsequent computation, enables high speed, high throughput testing of such magnets in a production facility. The magnets are first fully magnetized by capacitor discharge through a pulsing magnetizing coil, if not already fully magnetized, and their remanence can be noted at zero applied field. Then the magnets are progressively demagnetized, again by capacitor discharge through a pulsing coil, and, with the state of magnetization of the magnets and the strength of demagnetizing field continuously monitored, note is taken of the strength of the demagnetizing field when the magnetization of the magnet is reduced to zero. Based on this sole measurement, the coercivity of the magnet is derived. The apparatus employs a Hall effect probe with a Teslameter or coil system with a fluxmeter to monitor the state of magnetization of the test magnets and employs a peak-reading current meter to monitor the strength of the demagnetizing field.

13 Claims, 5 Drawing Sheets

METHOD FOR DEMAGNETIZING AND MEASURING REMANENCE AND COERCIVITY CHARACTERISTICS OF A MAGNETIC SAMPLE

FIELD OF THE INVENTION

The invention relates to a method of determining the characteristic of a magnetic sample and more particularly, though not exclusively, to a method employing a pulsed capacitor discharge system for applying a relatively high-strength magnetic field to a highly permanent magnet for demagnetising and measuring the remanence and coercivity characteristics thereof.

BACKGROUND OF THE INVENTION

The measurement of the magnetic characteristics of highly permanent magnetic materials, such as Rare-Earth Transition Metal magnets based on Nd—Fe—B or Sm-Co, conventionally requires the measurement of the hysteresis loop of the magnetic material. The material is first fully magnetised and then taken around its hysteresis loop by demagnetisation of the material. Measurement of the hysteresis loop enables various magnetic parameters of the material to be determined. The three parameters of main importance to permanent magnets are the remanence, the coercivity and the squareness factor. Generally, for permanent magnets, it is considered that high values for each of these parameters are desirable.

The remanence is the value of the magnetisation in the sample after it has be en magnetised, and is measured at zer o applied field. The intrinsic coercivity is the value of the applied demagnetising field required to reduce the magnetisation of an initially magnetised sample to zero. The zero magnetisation condition must be measured while the demagnetising field is being applied. The squareness factor of the magnet relates to the degree with which the magnetisation remains close to its remanence value as a demagnetising field is applied. There are various definitions for the squareness factor, but it always has a value between 0 and 1. Perhaps the most common representation is the ratio of the applied demagnetising field at which the magnetisation falls to 90% of its remanent value, to the intrinsic coercivity.

All three of these values may be obtained from the second quadrant demagnetisation curve of the magnet. To obtain this second quadrant curve, or indeed a full four-quadrant hysteresis loop, three basic type s of system are commercially available namely, permeameter systems, vibrating sample magnetometer systems, and pulsed magnetometer systems.

Permeameter systems employ electromagnets consisting of ferromagnetic iron-based cores and pole pieces, and current-carrying coils, to apply a magnetic field, and multi-turn coils linked to integrating fluxmeters to measure the magnetic properties of a sample in terms of the applied magnetising or demagnetising field and the corresponding magnetisation in the sample. Permeameter systems are accurate, and cheaper than the other two commercially available methods, (vibrating sample magnetometer and pulsed magnetometer, see below), but can only provide magnetic fields of the order of 2MA/m (25kOe), which are not sufficient for use with all highly coercive permanent magnets.

Furthermore, the permeameter method is a closed magnetic loop measurement system, and samples need to be placed and removed from between the pole pieces, which need to be wound open and closed for each sample. This is a time-consuming process, and, coupled with the time taken to obtain the results and calculate the magnetic parameters, makes the permeameter method too slow to be of use in magnetic characteristic production testing systems.

Vibrating sample magnetometer systems use an electromagnet, or, for higher fields, the core of a superconducting solenoid to enable the measurement of the magnetic characteristics. However, superconducting systems require liquefied gasses for their operation, are very expensive and have long run-up times typically in the order of a day which are impractical for many industries. Even the fastest lower-field electromagnet-based systems can take several minutes to measure the relevant magnetic parameters.

Pulsed magnetometer systems require the discharging of large capacitor banks into a resistive solenoid. Pulsed magnetometer systems do provide relatively high strength magnetic fields which are suitable for characterisation of highly permanent magnets. However, both the vibrating sample and pulsed magnetometer systems make open circuit measurements, which are intrinsically less accurate than closed circuit measurements of the permeameter systems. This is because open circuit measurements require demagnetisation calculations and assumptions to be made to estimate the average actual field the sample is subjected to.

Pulsed magnetometer and vibrating sample magnetometer systems work by varying the applied magnetic field to take the magnetic sample around its hysteresis loop. During this procedure, the applied magnetic field and the magnetism of the sample are measured by sampling and are recorded. Once the required data has been obtained and recorded, at the end of the sampling procedure, the recorded data is analysed to determine the required characteristics. This post-measurement analysis of the recorded data is complicated in that open-circuit correction factors are required. In addition, relatively expensive processing power is required and, more importantly, the time taken to obtain the useful values of the magnetic characteristics such as remanence and coercivity is lengthy. The time taken to obtain values of the desired characteristics typically takes minutes and is too long to make these systems economically viable as production testing systems.

SUMMARY OF THE INVENTION

The present invention aims to overcome at least some of the above described problems with the known magnetic characteristic measurement systems.

It is desired to provide a magnetic characteristic measuring system which is suitable for implementing economically viable production testing of magnetic samples. More particularly, it is desired to provide a magnetic characteristic measuring system which can measure the characteristics of each sample within several seconds to maintain the throughput of the characteristic measuring system at a sufficiently high level for commercial viability.

The present invention resides in the appreciation that for production testing, measurement of a full second quadrant demagnetisation curve or hysteresis loop, involving recording all sampled data and then processing the data to obtain the required characteristics, is not necessary. Rather, the minimum information required to characterise a magnetic sample may simply be an indication of the remanence and/or of the coercivity. In fact, an indication of the magnetic field strength produced at a certain distance from a fully magnetised sample, rather than the remanence, can be all that is required in some cases.

According to one aspect of the present invention there is provided a method of determining a desired magnetic characteristic of a magnetic sample, the method comprising sensing an applied magnetic field and the magnetisation of the sample along at least part of its hysteresis loop; recording selected measured values of the applied magnetic field and/or magnetisation of the sample corresponding to the values required to determine the desired characteristic; and determining the desired characteristic from the selected recorded values.

By selectively recording and processing sampled values of the magnetisation and applied field, it is possible to substantially reduce the time taken to produce results. In an embodiment of the invention, a repetition rate for characterising magnets of between 2 to 10 seconds is available depending on the size of the magnet to be tested, and on whether or not the magnet has to be magnetised prior to measurement. The speed at which each magnet can be characterised enables this method system of measurement to be suitable for production testing of magnetic samples. However, the present invention is advantageously considerably cheaper than existing pulsed magnetometer systems because there is no requirement for carrying out substantial calculations and using correcting factors and therefore the processing power required by the present invention is significantly lower than in the prior art systems. In the embodiments of the invention described hereinafter, simple analogue circuits are used rather than microprocesor based processing circuits.

For the present invention, as with all open circuit measurements, the sample experiences an effective demagnetising field as it is not in a closed magnetic circuit. This demagnetising field depends on the shape of the sample and the magnetic permeability ($\mu_0 M/H$) of the sample, and is directly proportional to the magnetisation (M) of the sample. The average permeability of the sample over the measurement range is readily determined or available, and demagnetisation factors for different aspect ratios and permeabilities are tabulated in standard texts. FIGS. 5a and 5b show, schematically, uncorrected data as measured by an open circuit method in FIG. 5a, and the same data corrected for demagnetisation factor in FIG. 5b. FIG. 5b is a much better indication of the intrinsic material properties, independent of the shape of the sample, which are required to be measured. It can be seen that the coercivity point at X is the same in both cases, as at zero magnetisation the demagnetisation factor vanishes. It can also be seen, however, that the remanence point Y on the corrected curve corresponds to a data point on the uncorrected curve at a positive applied field. Thus, while it may be acceptable to use the point Z, which is the magnetisation (or field at a pre-determined distance away) in zero applied field as an indication of the remanence, (and this will be fairly true for square Nd—Fe—B —type magnets), we could also use the magnetisation at point Y, measured at a field which we can estimate knowing the shape of the sample and the rough expected magnetisation, to be more accurate.

According to another aspect of the present invention, there is provided a method of determining the coercivity and remanence points of a magnetic sample about its hysteresis loop, the method comprising: measuring the magnetic field generated by the magnetic sample when the sample is fully magnetised to provide said remanence point on the hysteresis loop; demagnetising the fully magnetised sample; monitoring the reduction in the magnetic field generated by the sample during the demagnetising step; and measuring the applied magnetic field when the magnetic field produced by the sample equals zero so as to determine the coercivity point on the hysteresis loop, wherein the measurements of the remanence and the coercivity points are carried out without the need for determining the values on the hysteresis loop between the remanence and coercivity points.

According to another aspect of the present invention, there is provided a method of determining specific magnetic characteristics of a magnetic material sample at axis crossing points of the second quadrant of the sample hysteresis loop, the method comprising measuring and recording the specific characteristics at the axis crossing points without the need for recording the values of the hysteresis loop between the axis crossing points of the second quadrant.

According to another aspect of the invention there is provided an apparatus for determining desired magnetic characteristics of a magnetic sample, the apparatus comprising sensing means for sensing a magnetic field applied to the sample and the magnetisation of the sample along at least part of its hysteresis loop; recording means for recording selected measured values of the applied magnetic field and/or magnetisation of the sample corresponding to the values required to determine the desired characteristics; and determining means for determining the desired characteristics from the recorded values.

The above and further features of the present invention are set forth with particularity in the appended claims and will become clearer from consideration of the following detailed description of several exemplary embodiments of the present invention given with reference to the accompanying drawings.

DETAILED DESCRIPTION OF THE EMBODIMENTS

Figure 1:
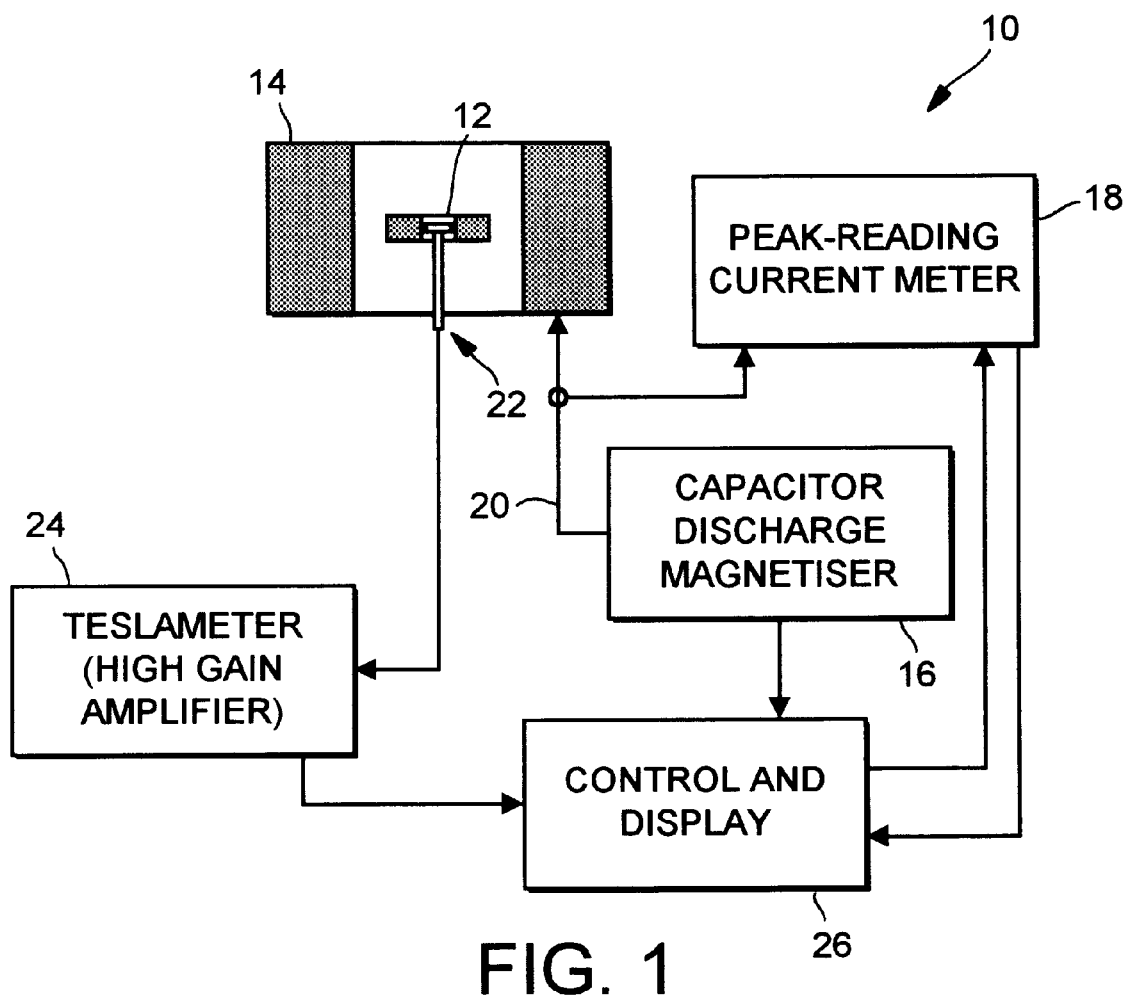
FIG. 1 is a schematic block diagram showing a magnetic characteristic measuring system embodying the present invention.

Referring to FIG. 1, there is shown an apparatus 10 for measuring magnetic characteristics of a permanent magnet of a first embodiment of the present invention. The apparatus 10 employs a pulsing coil 14 and a capacitor discharge magnetiser 16 for charging (if necessary) and discharging the permanent magnet 12. The magnetiser 16 includes a bank of capacitors (not shown) which can be charged up and discharged into the coil 14. The coil 14 generates either a magnetising magnetic field pulse or a demagnetising magnetic field pulse depending on the direction of discharged current flow through the coil 14.

A peak-reading current meter 18, which is coupled to a current carrying conductor 20 between the magnetiser 16 and the coil 14, is used for measuring the value of the peak current in the coil 14. The current meter 18 enables the magnetic field generated by the pulsing coil 14, i.e. the applied magnetic field at any instant, to be calculated.

The magnetic field generated by the pulsing coil 14 and the magnet 12 is sensed by a Hall effect probe 22 (a Hall effect sensor) which is provided at a predetermined small distance from the surface of the magnet 12. The Hall probe 22 therefore measures the flux density at a small distance from the surface of the magnet 12. This measure of flux density or "figure of merit" is often preferred to the absolute remanence value as it is a more practical measure of what magnetic field can be provided by the magnet in a given application. The Hall probe 22 is coupled to a Teslameter 24 which is a high gain amplifier for amplifying the small voltage signals generated by the Hall probe 22.

The Teslameter 24 is connected to a control and display module 26 which is used to log the data generated by the Hall probe 22 and the Teslameter 24 for each magnet 12. The control and display module 24 is also connected to the capacitor discharge magnetiser 16 and the peak-reading current meter 18. The control and display module 26 comprises simple dedicated analogue electronic circuits (not shown) for timing control and calculating the required values of remanence and coercivity, for example analogue capacitors and summing amplifiers. As the apparatus 10 is designed specifically for use in production testing of magnets, the control and display module 26 comprises a data logger (not shown) which records the measured characteristics of remanence and coercivity for each of a plurality of magnets that are tested. This recorded information can then be used to group together magnets with similar characteristics.

The display part of the control and display module is designed to give an immediate indication of the characteristics of the magnet 12. A microprocessor controlled screen could be used for this purpose but it would prohibitively increase the cost of the apparatus 10 and is not necessary. Rather a set of condition indicating light bulbs are provided for displaying the results of each measured characteristic. More particularly, for the remanence, 3 light bulbs (not shown) are provided : the first bulb indicating a "high fail"i.e. when the remanence of the magnet 12 fails to meet the required remanence value by a relatively large amount; the second light bulb indicating a "low fail"i.e. when the remanence of the magnet fails to meet the required remanence by a relatively small amount; and the third light bulb indicating a "pass" i.e. when the remanence the magnet 12 meets the required remanence value within predetermined tolerance limits. Another set of light bulbs would be provided for the coercivity values of the magnet. Various other types of simple displays could be used in place of the light bulb display such as audible warning signals.

Figure 2:
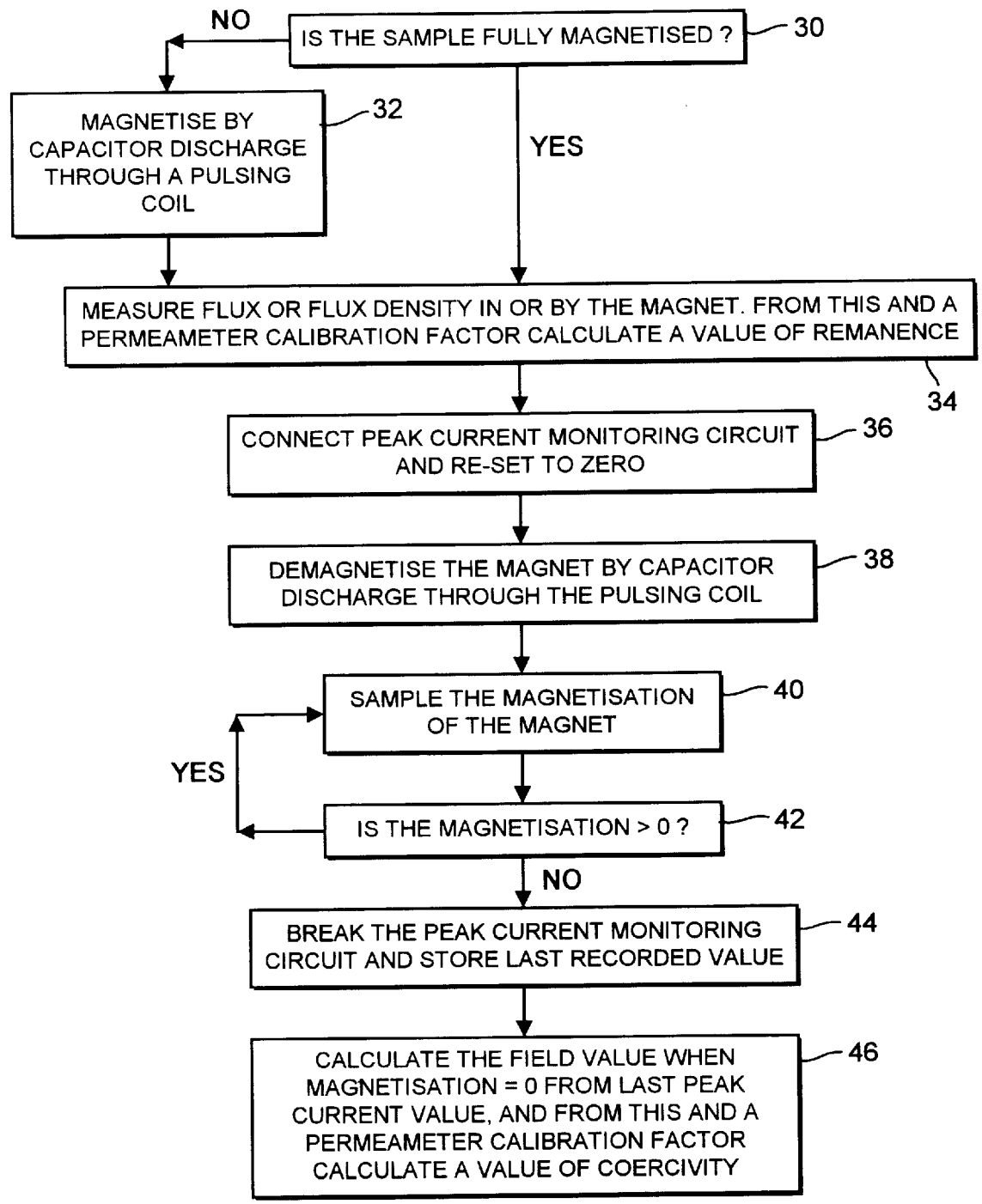
FIG. 2 is a schematic flow diagram illustrating a method of measuring the characteristic of a magnetic material embodying the present invention.

Referring now to FIG. 2, a method of measuring the characteristics of the magnet 12 using the above described apparatus 10, is described.

To measure the characteristics of the permanent magnet 12, the magnet 12 is placed inside the pulsing coil 14 at a predefined position with respect to the Hall probe 22. The magnet 12 or magnetic sample is checked at 30 to determine whether the magnet 12 is fully magnetised. If the magnet 12 is not fully magnetised, the capacitor discharge magnetiser 16 discharges its capacitor banks and generates a sufficiently large magnetic pulse in the coil 14 to fully magnetise the magnet 12 at 32. Then, the remanence of the fully magnetised magnet can be measured at 34 from the magnetic field readings taken by the Hall probe 22 and the Teslameter 24. The actual remanence value is calculated at 34 in the control and display module 26 by multiplying a calibration factor with the measured magnetic field reading. The calibration factor has previously been calculated by measuring the actual remanence of a similar magnet using accurate permeameter measurements and comparing these results with those obtained using the Hall probe 22 on the same magnet. The calibration factor is used to convert the readings from the apparatus 10 into values comparable with those obtained from an accurate permeameter measurement.

Figure 5A:
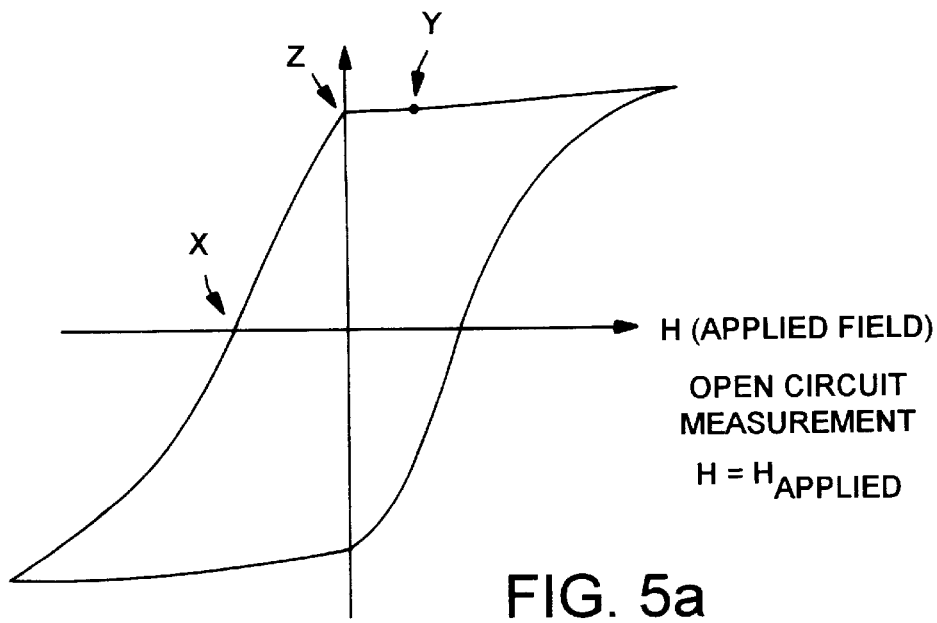
FIGS. 5a and 5b are respective schematic hysteresis loop plots of uncorrected and corrected data as obtained by an open circuit measurement method.
Figure 5B:
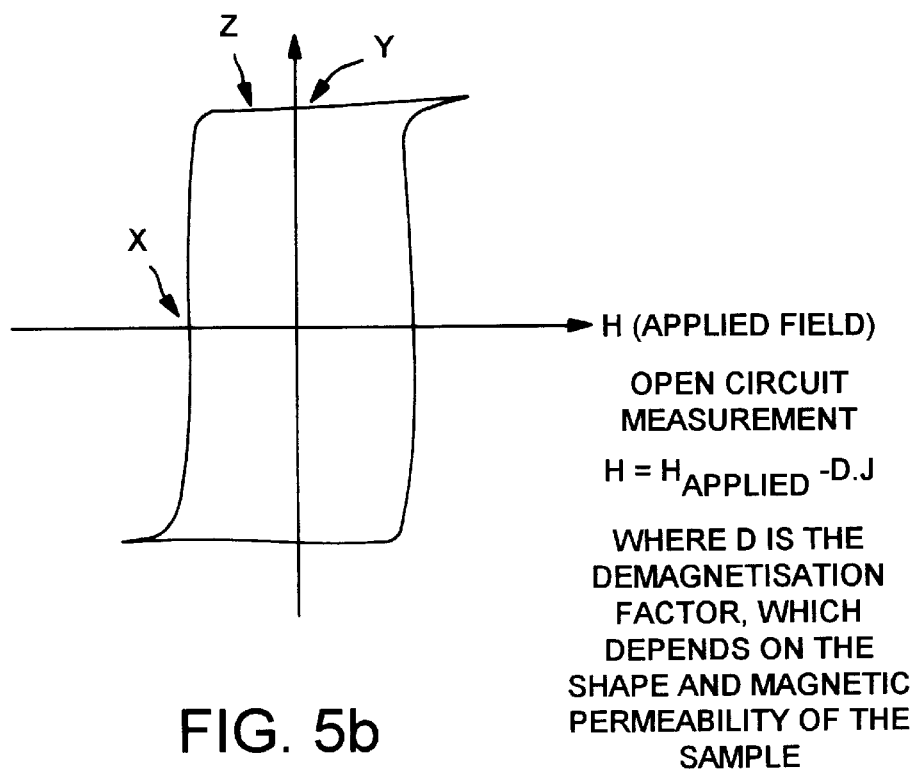

In addition, as explained previously with reference to FIGS. 5a and 5b, it may be more accurate to measure the magnetisation of the magnet at a small predetermined, positive applied field value which compensates for the inherent effect of the demagnetising field on the sample as it is not in a closed circuit measurement circuit. Such a predetermined applied field value can be estimated using the dimensions of the sample and the approximate expected magnetisation.

Once the remanence value has been obtained at 34, the peak-reading current meter 18 or peak current monitoring circuit 18 is connected into circuit and is reset to zero at 36. Then, the magnet 12 is demagnetised or at least partially demagnetised at 38 by the application of a magnetic pulse generated by the discharge of the magnetiser capacitor banks into the pulsing coil 14. The magnetic pulse has an opposite polarity to that of a magnetising pulse that may have been used to fully magnetise the magnet 12.

During the demagnetisation of the magnet 12, the magnetic field at the predetermined position near the surface of the magnet, as measured by the Hall probe 22 and the Teslameter 24, is constantly monitored (by sampling) at 40 by the control and display module 26.

This sampled magnetic field value is the sum of the magnetic fields from the magnet 12 and the pulsing coil 14. The applied magnetic field due to the pulsing coil 14 at any instant is calculated from the value of the current in the coil 14 and the coil characteristics, and this is subtracted from the Hall probe reading to give the field due to the magnet 12. The calculated magnetic field or magnetism of the magnet 12 is checked at 42 to see whether or not it is zero. While this calculated value of magnetisation is greater than zero, the sampling process 40, 42 is repeated. However, when this calculated value of magnetisation reaches zero, the control and display module 26 disables the peak-reading current meter circuit at 44 and stores the last recorded peak current value.

To determine the coercivity of the magnet 12, the applied magnetic field value when the magnetisation of the magnet 12 equalled zero is calculated from the last recorded value of peak current at 46. This calculated applied field value is multiplied by another calibration factor, previously determined from accurate permeameter measurement on a similar magnet, to give a value for coercivity at 46.

The calibration factors for remanence and coercivity are very different to the correction factors that are used with the post-measurement processing of the prior art open-circuit systems. The prior art correction factors are used to convert the inherently inaccurate open-circuit readings of magnetisation and applied field to absolute values of the hysteresis curve of a magnet without relying on the results of any other system. In contrast, the calibration factors are used to calibrate the results of the apparatus 10 with those measured for a similar magnet by an inherently accurate closed-circuit permeameter.

In the above described embodiment of the present invention, the remanence and coercivity are determined in a time period of 2 to 10 seconds depending on the size of the magnet to be tested, the period determining factor being the time required to charge up the capacitors. This speed allows the present embodiment to be used in mass testing of magnets, say in a production line. It is readily appreciated how magnets or magnetic samples on a conveyor could be passed individually through a testing station incorporating the above-described apparatus 10. Once the characteristics of a magnet had been obtained, the magnet could be removed from the apparatus 10 and the testing process could be repeated for the next magnet.

Figure 3:
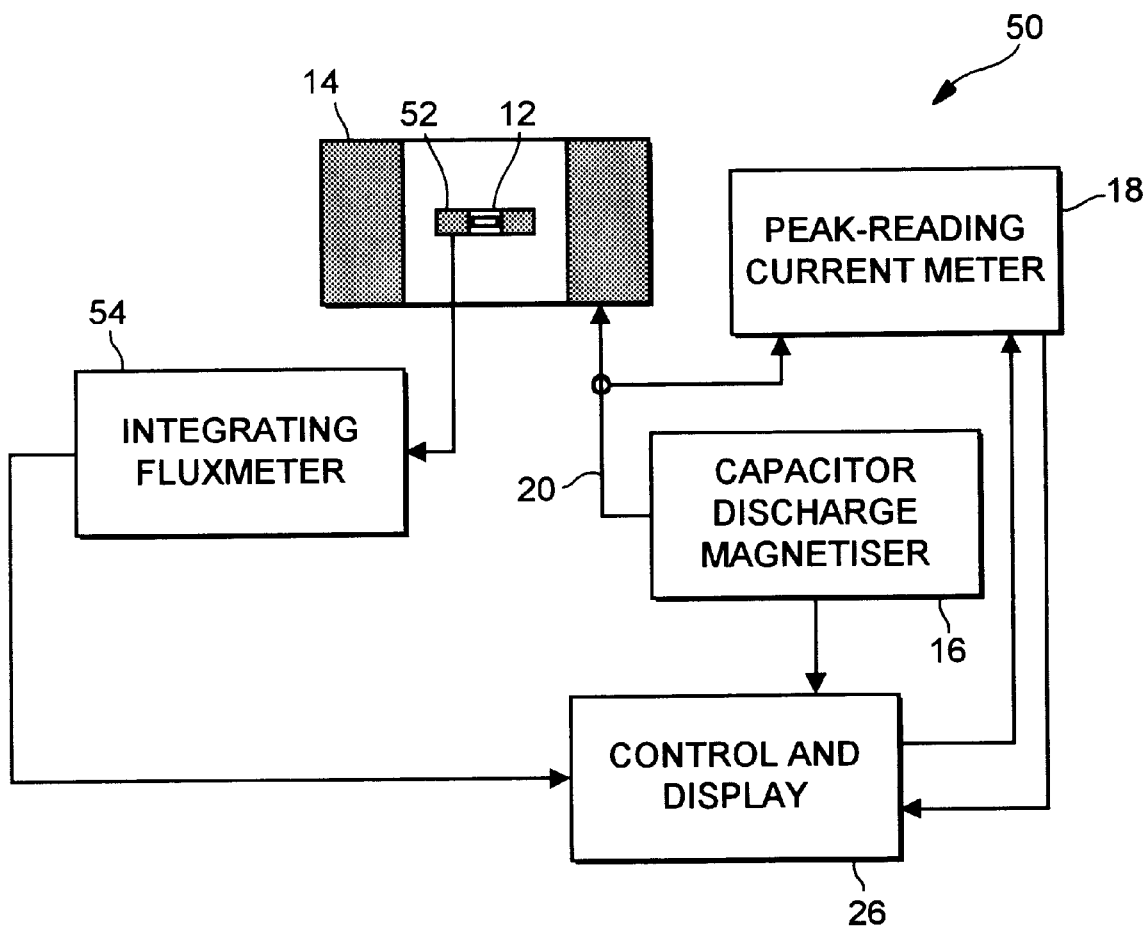
FIG. 3 is a schematic block diagram showing another magnetic characteristic measuring system embodying the present invention.

Referring now to FIG. 3, an apparatus 50 of a second embodiment of the present invention is described. The apparatus 50 is identical to the apparatus 10 of the first embodiment, except that the magnetic field sensing instrument (Hall probe 22 and Teslameter 24) has been replaced by a measurement coil 52 and an integrating fluxmeter 54. The other parts of the apparatus 50 are the same as those of apparatus 10 and the same reference numerals have been used for corresponding parts. In addition, apparatus 50 is used in the same manner as the apparatus 10 to obtain the remanence and coercivity characteristics as explained hereinabove and described in FIG. 2. For the sake of convenience, only the differences between the apparatuses 10, 50 and their methods of use will be described hereinafter.

The measuring coil 52 is provided within the pulsing coil 14 and is arranged to be relatively tightly wound around the magnet 12. However, the measuring coil 52 provides sufficient space to allow the repetitive insertions and withdrawals of magnets 12 during mass testing of magnets. The measuring coil 52 is connected to the integrating fluxmeter 54 which, in turn, is connected to the control and display module 26.

The integrating fluxmeter 54 measures the total changing magnetic flux at the magnet 12 using the measuring coil 52. The measurement of the total integrating flux is a more direct measure of the magnetic flux of the magnet than is measured by the Hall probe 22 in the previous embodiment, because the measuring coil 52 samples a greater volume. This flux measurement may be of greater use if the characteristics of the material which comprises the magnet 12 are required. However, in this embodiment, the measured total integrating flux is used to determine the magnetism of the magnet 12 as is required in the previous embodiment and so the measuring coil 52 and fluxmeter 54 are an equivalent replacement because they carry out the same function as the Hall probe 22 and the Teslameter 24.

The total magnetic flux value is the sum of the magnetic flux due to the magnet 12 and the pulsing coil 14. The flux due to the pulsing coil 14 at any instant may be calculated from the value of the current in the pulsing coil 14 and the pulsing coil characteristics, and this flux value is subtracted from the fluxmeter value to give the flux due to the magnet 12. This calculation is used when measuring the coercivity of the magnet 12 as has been explained hereinbefore with reference to the first embodiment. In addition, the remanence is determined from measurement of the flux of a fully magnetised magnet 12 using the measuring coil 52 and the fluxmeter 54.

Another method of measuring the magnetisation of the sample is as follows. A further coil (not shown) of one or only a few turns may be wound around the outside of the pulsing coil 14 in the opposite sense to the measuring coil 52 of the second embodiment. In practice, a trimming resistor may be used to accurately balance the coils. When the coils are balanced, zero output is given by the measuring coil 52 in a changing applied magnetic field if no magnet 12 is present. When the magnet 12 is placed inside the measuring coil 52, the output from the balanced coils is proportional to the magnetisation of the sample if the further coil (not shown) is sufficiently larger in diameter than the cross section of the sample so that all measurable flux loops from the sample effectively complete themselves within the diameter of the other coil (not shown); that is the other coil (not shown) does not sense the magnetisation of the sample. Accordingly, there is then no requirement to calculate and subtract the value of the magnetic field generated by the pulsing coil 14 from the output of the balanced coils.

Figure 4:
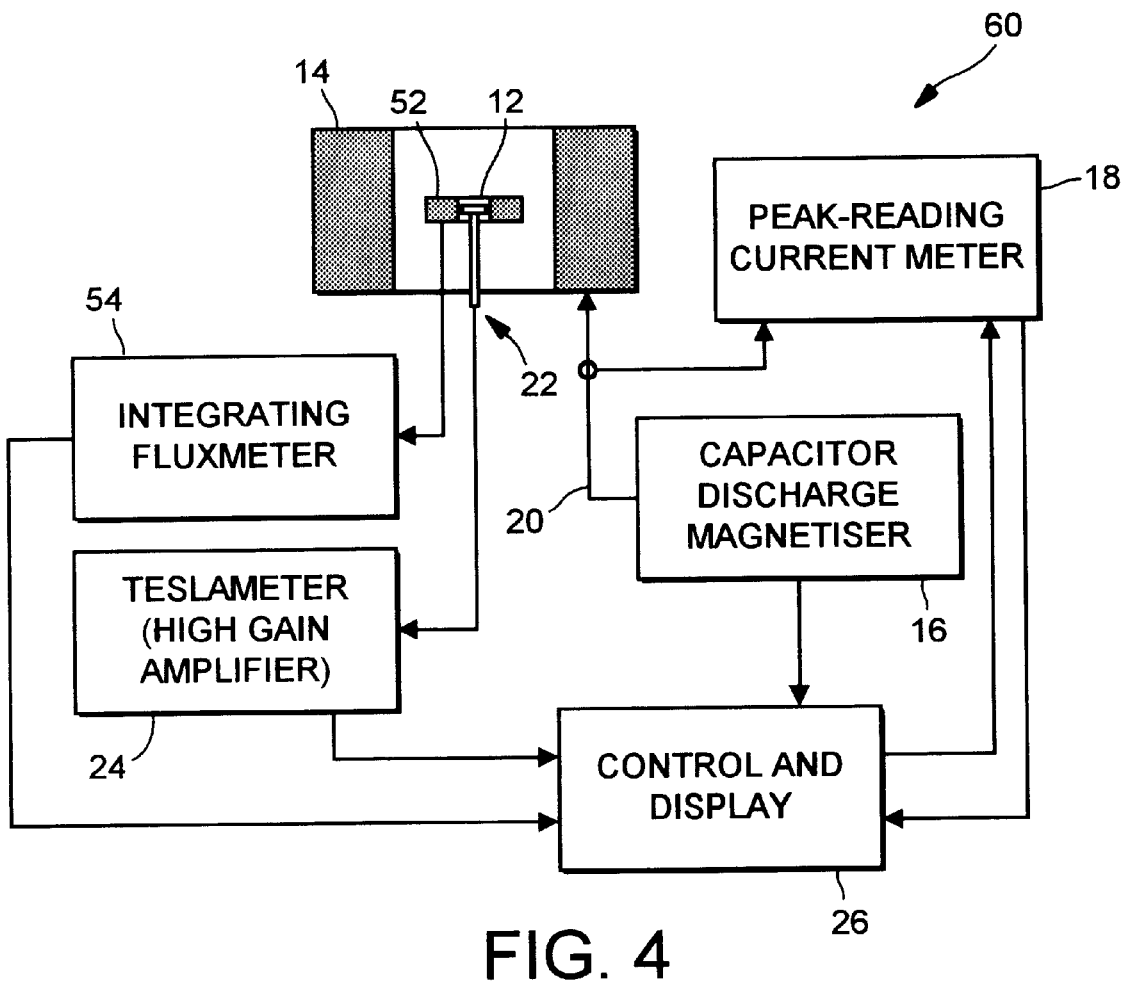
FIG. 4 is a schematic block diagram showing another magnetic characteristic measuring system embodying the present system.

Referring now to FIG. 4, an apparatus 60 for measuring the magnetic characteristics of a permanent magnet 12 of a third embodiment of present invention is shown. The apparatus 60 is identical to the apparatuses 10, 50 of the first and second embodiments except that the apparatus 60 employs two independent sets of magnetic field sensing instruments, namely a Hall probe 22 and Teslameter 24, and a measuring coil 52 and an integrating fluxmeter 54. In this way, the apparatus 60 is a combination of the apparatuses 10, 50 of the first and second embodiments. To avoid unnecessary repetition, only the differences between the apparatus 60 and the previously described apparatuses 10, 50 will be explained hereinafter.

As can be seen from FIG. 4, the control and display module 26 receives magnetic field strength information from both the Teslameter 24 and the integrating fluxmeter 54. The apparatus 60 only uses one of these magnetic field sensing instruments at a time depending on the type of measurement required. The selection of the Hall probe 22 and Teslameter 24 gives more stable (less drift) results than by using the coil 52 and fluxmeter 54. However, if the coil 52 and fluxmeter 54 are selected, a more direct measure of the flux due to the magnetic material of the magnet 12 is obtained. Another advantage of using a Hall probe 22 rather than a measuring coil 52 is that the Hall probe 22 is more universal in that it only needs to be positionally adjusted for vastly different sizes of magnet. However, a set of measuring coils 52 is required for different sizes of magnets and this requirement would increase the cost of the apparatus 60.

The method of determining the remanence and the coercivity is the same as that described hereinbefore with reference to FIG. 2. However, the two sets of results from the two independent magnetic field sensing instruments 22, 24 and 52, 54 require the use of different predetermined calibration factors to obtain the required remanence and coercivity values.

A fourth embodiment of the present invention, described hereinafter, is based on a modification of the second embodiment as described with reference to FIG. 3. Accordingly, for the sake of brevity, only the differences between the apparatuses of the second and fourth embodiments is described hereinbelow.

The apparatus of the fourth embodiment incorporates the apparatus 50 of the second embodiment and, in addition, comprises an additional magnetic field sensing instrument (not shown), namely an additional measuring coil and associated integrating fluxmeter (not shown), connected up in parallel to the control and display module 26.

The additional measuring coil is positioned within the pulsing coil 14 and laterally displaced from the measuring coil 52. The additional measuring coil measures the flux generated by the pulsing coil 14 but not the flux generated by the magnetism of the magnet 12. As the additional measuring coil is wound in opposition to the measuring coil 52, it produces an opposite polarity output to that of the measuring coil 52. When the outputs of the additional and measuring coils are summed at the control and display module 26, the flux produced by the pulsing coil 14 cancels out and the resultant signal is a measure of the flux produced by the magnetisation of the magnet 12 alone. In this way, the functions performed by the control and display module 26 are minimised.

If it is desired to provide a universal measuring coil 52 which is large enough to accommodate various sizes of magnets 12, then further measuring coils may be required to compensate for the fact that the measuring coil 52 may not be tightly wound around the magnet 12. Typically, a 3 or 5 coil set up may be employed with an appropriate fluxmeter arrangement, e.g. the provision of two or more corresponding fluxmeters. The further measuring coils would be wound in an opposite sense to the measuring coil 52 and could be balanced with the measuring coil 52 by appropriate trimming resistors (not shown). These further coils would be appropriately balanced and switched in to measure the flux value to be subtracted from the readings of the measuring coil 52 to provide an accurate flux measurement of the magnetisation of the magnet 12.

In each of the above embodiments, only two characteristics of a magnet 12 are being measured namely, remanence and coercivity. However, the apparatuses of these embodiments can readily be set up to measure other characteristics such as the squareness factor of a magnet 12. This could be done by setting a comparator circuit in the control and display module 26 to sense when the current magnetisation of the magnet 12 has fallen to 90% of the measured remanence and then recording the value of the applied field at that instant as measured by the peak-reading current meter 18. As this recorded value of applied field is measured by an open magnetic circuit method, it would need to have a correction factor applied thereto to determine the actual value of the applied field at this 90% magnetisation point. The ratio of the corrected applied field value to the coercivity would provide the squareness factor. without correction, the ratio produced would be not the actual squareness factor but something proportional to the actual squareness factor.

The above described embodiments could readily form part of a pulsed discharge demagnetiser as described in our copending British application no. 9627119.2.

Having thus described the invention with reference to several particular embodiments, it is to be appreciated that the described embodiments are exemplary only and are susceptible to modification and variation without departure from the spirit and scope of the invention as determined in the appended claims.

For example, even though the embodiments have been described for testing a relatively high-strength permanent magnets such as a Rare Earth Transition Metal based magnets, other less strong magnets and other magnetic materials can also be characterised by the method and apparatus of the present invention.

What is claimed is:

1. A high speed method of characterizing high coercivity permanent magnets for high throughput production testing of the same, said method comprising:

(a) providing a fully magnetized high coercivity magnet for testing;

(b) subjecting said fully magnetized high coercivity magnet to a progressively changing magnetic field such as progressively to demagnetize the magnet;

(c) monitoring the state of magnetization of the magnet during the progressive demagnetization step;

(d) monitoring the strength of said progressively changing magnetic field during said progressive demagnetization step;

(e) noting the strength of said progressively changing magnetic field when the magnetization of the magnet is reduced to zero; and (f) deriving from said noted strength an indication of the coercivity of the magnet;

wherein the progressive demagnetization of the magnet around its hysteresis curve is not recorded.

2. The method as claimed in claim 1, wherein step (a) includes the step of magnetizing the test magnet by subjecting it to a progressively changing magnetic field such as progressively to magnetize it.

3. The method as claimed in claim 1, further comprising determining the remanence of the fully magnetized high coercivity magnet at zero applied magnetic field before proceeding with demagnetizing step (b).

4. The method as claimed in claim 3, wherein the remanence is determined by measurement of the magnetic flux density a predetermined short distance from the test magnet by means of a Hall effect probe coupled to a Teslameter.

5. The method as claimed in claim 3, wherein the remanence is determined by measuring the magnetic flux in the magnet by means of coil means coupled to an integrating fluxmeter.

6. The method as claimed in claim 1, wherein subjecting step (b) is effected by capacitor discharge through a pulsing coil, and monitoring step (d) is effected by means of a peak current monitoring means measuring the current in said pulsing coil.

7. The method as claimed in claim 1, wherein monitoring step (c) is effected by means of a Hall effect probe coupled to a Teslameter which monitors the magnetic field at a predetermined small distance from the test magnet, and by deducting from the resultant magnetic field value the concurrent magnetic field value determined by monitoring step (d) and corresponding to the concurrent strength of the progressively changing magnetic field.

8. The method as claimed in claim 1, wherein monitoring step (c) is effected by measuring the total magnetic flux through coil means closely enclosing the test magnet, and by deducting from the resultant magnetic field value the concurrent magnetic field value determined by monitoring step (d) and corresponding to the concurrent strength of the progressively changing magnetic field.

9. The method as claimed in claim 1, wherein monitoring step (c) is effected by measuring the total magnetic flux through first coil means closely enclosing the test magnet, and by providing second coil means associated with means developing said progressively changing magnetic field and coupled with said first coil means, said first and second coil means being balanced when no magnet is present in said first coil means.

10. The method as claimed in claim 1, wherein deriving step (f) comprises converting the coercivity indication into an absolute value by utilization of predetermined correction factor(s).

11. The method as claimed in claim 1, further comprising determining the remanence of the fully magnetized high coercivity magnet before said subjecting step (b) by subjecting the magnet to a small magnetic field poled oppositely to the magnetic field developed during said subjecting step (b) and selected to compensate for the effect of the presence on the magnet of the means employed to perform said subjecting step (b).

12. The method as claimed in claim 1, performed successively on a plurality of test magnets, and wherein a classification indication is given for respective tested magnets.

13. The method as claimed in claim 1, further comprising determining a squareness factor related to the test magnet by noting the strength of the magnetic field applied during subjecting step (b) at which the state of magnetization monitored in monitoring step (c) reduces by a predetermined amount, and relating such noted field strength to the derived coercivity of the magnet.

* * * * *